United States Patent [19]

Hirota

[11] Patent Number: 5,578,166
[45] Date of Patent: Nov. 26, 1996

[54] METHOD OF REACTIVE ION ETCHING OF A THIN COPPER FILM

[75] Inventor: Takatoshi Hirota, Kawasaki, Japan

[73] Assignee: Fujitsu Limited, Kanagawa, Japan

[21] Appl. No.: 449,340

[22] Filed: May 24, 1995

Related U.S. Application Data

[63] Continuation of Ser. No. 187,725, Jan. 28, 1994, abandoned.

[30] Foreign Application Priority Data

May 17, 1993 [JP] Japan ................................. 5-113542

[51] Int. Cl.$^6$ ................................................. H01L 21/28
[52] U.S. Cl. ........................ 156/643.1; 156/646.1; 437/198; 437/245
[58] Field of Search ................................ 437/198, 245, 437/246, 187; 156/643.1, 646.1; 216/78

[56] References Cited

U.S. PATENT DOCUMENTS

| | | | |
|---|---|---|---|
| 4,352,716 | 10/1982 | Schaible et al. | 437/245 |
| 4,557,796 | 12/1985 | Druschke et al. | 156/643 |
| 4,618,398 | 10/1986 | Nawata et al. | 156/646 |
| 4,838,994 | 6/1989 | Gulde et al. | 156/643 |
| 4,931,410 | 6/1990 | Tokunaga et al. | 437/189 |
| 5,200,032 | 4/1993 | Shinohara | 156/664 |
| 5,318,666 | 6/1994 | Douglas | 156/635 |

FOREIGN PATENT DOCUMENTS

| | | |
|---|---|---|
| 433983 | 6/1991 | European Pat. Off. . |
| 01308028 | 12/1989 | Japan . |

OTHER PUBLICATIONS

Ohno et al., Jap. J. Appl. Phys., vol. 28, No. 6, Jun. 1989, pp. L1070–L1072.

Primary Examiner—George Fourson
Assistant Examiner—Thomas G. Bilodeau
Attorney, Agent, or Firm—Nikaido, Marmelstein, Murray & Oram LLP

[57] ABSTRACT

The method to etch an electrically conductive film comprises the steps of: forming a metal conductor film comprising copper or copper alloy, upon a substrate; and forming a mask pattern upon the metal conductor film; and etching an exposed part of the metal conductor film by the use of the mask pattern and a reactive ion-etching (RIE) employing a plasma of a gas mixture comprising a silicon tetra-chloride ($SiCl_4$) gas, a nitrogen ($N_2$) gas and a carbon compound gas, so that the exposed part of the metal conductor film is removed so as to leave the masked part. The metal conductor film may further comprise a diffusion protection layer formed of a refractory metal or its alloy upon and/or underneath the copper/mainly-copper layer. The mask pattern may be typically formed of silicon dioxide ($SiO_2$). The substrate may further comprise an insulating layer thereon, typically formed of silicon dioxide ($SiO_2$), for contacting said metal conductor film. The carbon compound gas may typically be a carbon tetra-chloride ($CCl_4$), methane ($CH_4$), ethane ($C_2H_6$) or propane ($C_3H_8$) and so on. When $SiCl_4$ is employed the content may typically be 6.6 to 15% by volume in the gas mixture. When methane ($CH_4$) gas is employed the content may typically be 8 to 18% by volume in the gas mixture. The etching step may preferably performed at a substrate temperature higher than 250° C.

16 Claims, 7 Drawing Sheets

AT HIGHER THAN 330°C

CCl₄: 10%

Fig.10

CCl₄ > 15%

METHOD OF REACTIVE ION ETCHING OF A THIN COPPER FILM

This application is a continuation of application Ser. No. 08/187,725 filed Jan. 28, 1994 now abandoned.

BACKGROUND OF THE INVENTION

1. Field of the Invention

The present invention relates to a method of a selective ion etching of a copper thin film which has been deposited on a substrate.

2. Description of the Related Arts

Many of internal wiring for electronic devices, such as semiconductor devices, are formed of a wiring pattern by selectively etching an electrically conductive thin film which has been deposited on a substrate.

Aluminum has been conventionally employed as the material of the electrically conductive thin film. However, for a future fine wiring pattern requiring a high current density therein, copper wiring is required due to its excellent anti-corrosion as well as a low electrical resistance on the high current density condition.

In fabricating the copper wiring pattern a high etching speed is demanded in order to achieve an appropriate productivity. In addition, in order to attain an accurate pattern, an etching selectivity, which allows the use of a thin mask, as well as an etching anisotropy, which allows an accurate shape in the sectional view having no side-etching, are required.

Reactive-ion-etching, referred to hereinafter as RIE, has been an excellent means in forming fine wiring patterns. RIE provides a good anisotropic etching by both of a chemical reaction and physically an ion bombardment. Moreover, RIE has as known well a possibility in that the etching speed can be fast as well as the ratio of the etching speed ratio of the material to be etched to the etching speed of the mask material can be enhanced. However, only a little has been known about a RIE method that allows a copper thin film to be etched selectively as well as anisotropically.

There was, for example, reported a RIE of the copper thin film which used plasma of a gas mixture of $CCl_4$ and Ar, by G. C. Sehwart and P. M. Sehlble as "Reactive Ion Etching of Copper Films", on Journal of Electrochemical Society 130, p. 1777, (1983). Here was used a silicon oxide film as a etching mask. Etching speed of this RIE using the gas mixture of $CCl_4$ and Ar was small. Therefore, it was necessary to increase the electric power density to excite the plasma in order to hasten the etching speed. Under the condition of the high electric power density, the etching speed ratio of the copper film to the silicon oxide mask, in other words an etching selectivity, was not so large, for example, the etching speed ratio was only about 1 to 1.5. Therefore, a thick etching mask had to be used, resulting in a deterioration of the wiring pattern accuracy. Moreover, under the condition of the slow etching speed, it was difficult to etch a narrow ditch because new copper is adhered onto the sidewall of the etched ditch.

Another method to etch a copper film was reported by Kazuhide Ohno, Masaaki Sato, and Yoshinobu Arita in the title of "High Rate Reactive Ion Etching of Copper Films in $SiCl_4$, $N_2$, $Cl_2$ and $NH_3$ Mixture" on p. 215–218 (1990) of Extended Abstract of 22nd (1990 International) Conference on Solid State Devices and Materials, held in Sendai. It is reported there that the etching speed of the copper thin film in this RIE was 100 nm/minute, which was much faster than the etching speed (20 nm/minute) of the case where a gas mixture merely of the silicon tetrachloride and nitrogen was used as the etching gas. However, in this method of the RIE of the copper thin film it was difficult to achieve an etching speed more than this without deterioration in the shape accuracy of the etched copper thin film pattern.

On the other hand, a RIE of a thin aluminum alloy film containing 1% copper employing a gas mixture of $SiCl_4$, $N_2$, and $CCl_4$ was disclosed in Japanese Provisional Patent Publication Sho 63-181429 (1988). In the preferred embodiment disclosed in this publication, it was reported that the etching speed was 750 nm/minute, the etching speed ratio of a thin 1% Al-1% Si—Cu alloy film to the $SiO_2$ film was 12, the decrease in the wiring width was 0.1 µm, and the etching was accomplished without leaving copper residue on the surface of the substrate surface, under the condition that the resist pattern was used as a mask, the electrode on which the substrate was placed was water-cooled, and the gas flow ratio of reaction gas of $SiCl_4$, $N_2$, and $CCl_4$ was 55%: 15%: 30%.

Thus, in the prior art RIE method for thin copper film there were disadvantageous problems in that the etching speed was low, it was apt to cause a side-etching, and accordingly, it was impossible to reproduce an accurate pattern due to the inadequate etching selectivity between the mask and the copper film.

SUMMARY OF THE INVENTION

It is a general object of the invention to provide a RIE method to accomplish a high etching speed as well as a highly accurate etched pattern of copper or mainly copper alloy, while causing none of side etching of the etched pattern.

It is generally difficult to apply the results obtained in the prior art method for the aluminum alloy film immediately onto a practical etching of a copper film without any experimental support or theoretical support. Then, the inventor of the present invention has attempted to find out a condition most optimum to etch the thin copper film in a RIE employing a gas mixture of $SiCl_4$, $N_2$, and $CCl_4$ as a reaction gas. Thus, the present invention is based on the results obtained from the experiments.

The method of the present invention to etch an electrically conductive film comprises the steps of: forming a metal conductor film comprising copper or copper alloy main component of which is copper, upon a substrate; and forming a mask pattern for covering a part of the metal conductor film and for exposing other part of the metal conductor film than the covered part, upon the metal conductor film; and etching the exposed part of said metal conductor film by the use of said mask pattern and a reactive ion-etching (RIE) employing a plasma of a gas mixture comprising a silicon tetra-chloride ($SiCl_4$) gas, a nitrogen ($N_2$) gas and a carbon compound gas, so that the exposed part of the metal conductor film is removed so as to leave the masked part. The metal conductor film may further comprise a diffusion protection layer formed of a refractory metal or its alloy upon and/or underneath the copper/mainly-copper layer. The mask pattern may be typically formed of silicon dioxide ($SiO_2$). The substrate may further comprise an insulating layer thereon, typically formed of silicon dioxide ($SiO_2$), for contacting said metal conductor film. The plasma may typically be formed of a gas mixture comprising a silicon tetra-chloride ($SiCl_4$) gas, a nitrogen ($N_2$) gas and a carbon compound gas, such as carbon tetra-chloride ($CCl_4$), methane ($CH_4$), ethane ($C_2H_6$) and propane ($C_3H_8$). When $SiCl_4$ is employed the content may typically be 6.6 to 15% by volume in the gas mixture. When methane ($CH_4$) gas is employed the content may typically be 8 to 18% by volume in the gas mixture. The etching step may performed preferably at the substrate temperature between 250° to 330° C.

The above-mentioned features and advantages of the present invention, together with other objects and advantages, which will become apparent, will be more fully described hereinafter, with references being made to the accompanying drawings which form a part hereof, wherein like numerals refer to like parts throughout.

DESCRIPTION OF THE PREFERRED EMBODIMENT

Referring to FIGS. 1, a first preferred embodiment of the present invention is hereinafter described in detail. In the preferred embodiment a wiring pattern electrically connecting between circuit elements, such as transistors, etc., is formed on a silicon substrate 1.

Figure 1A:
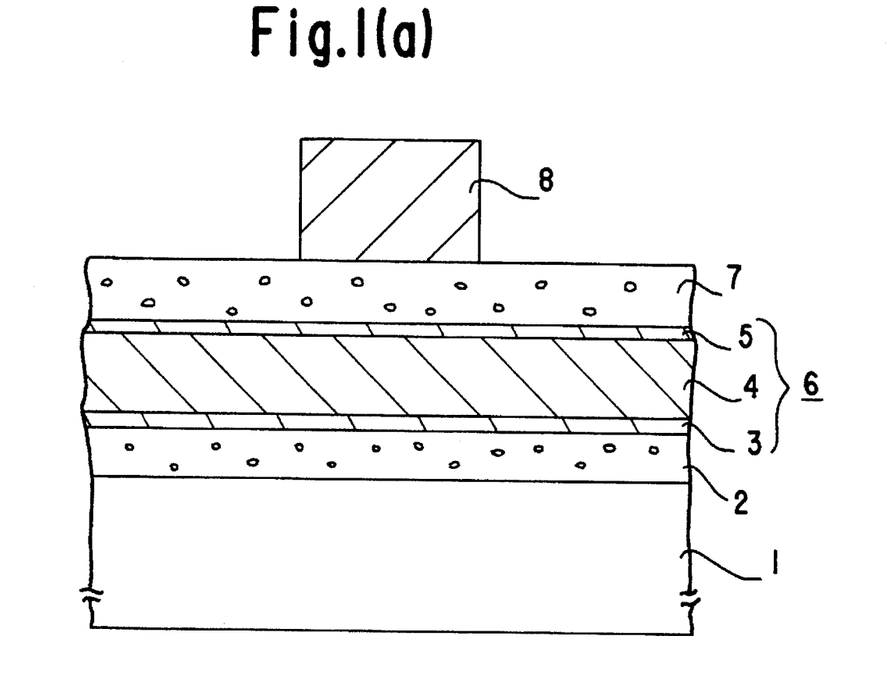
FIGS. 1(a) to 1(d) schematically illustrate cross-sectional views of copper wiring pattern of a semiconductor device at each step of the method of the preferred embodiment of the present invention.

The circuit elements (not shown in the figures) have been fabricated by well-known method on silicon substrate 1. As shown in FIG. 1a a first insulation film 2 typically of 1 μm thick $SiO_2$ is formed by a usual method of forming insulation films (for instance, thermal oxidation of silicon or deposition of the insulation film) on a surface of substrate 1. First insulation film 2 is to electrically insulate a wiring pattern from substrate 1. Therefore, if the substrate is insulative first insulation film 2 is not indispensable.

Next, a first refractory metal layer 3 typically of a 50 nm thick tantalum (Ta) film is deposited as a first diffusion barrier on first insulation film 2 by a sputtering method. On first insulation film 2 is deposited a core copper layer 4 typically of a 1 μm thick 1%Si-Cu film typically with a sputering method. On copper layer 4 is deposited typically with a sputtering method a second refractory metal layer 5 typically of a 50 nm thick tantalum (Ta) film, as a second diffusion barrier. Thus formed is an electrically conductive film 6 having the diffusion barriers 3 and 5 on both the surfaces of core copper layer 4. Above-mentioned sputtering processes were carried out while keeping the substrate temperature at 200° to 300° C. First diffusion barrier 3 prevents diffusion of copper from core copper layer 4 into first insulation film 2 formed of $SiO_2$ so as to prevent deterioration of the insulation of first insulation film 2. Moreover, the diffusion barriers has an advantageous effect to improve the adhesion of the core copper layer onto $SiO_2$ layers. Therefore, the diffusion barriers prevent an $SiO_2$ etching mask 7 and a wiring pattern (both of which will be described later) from flaking off from core copper layer 4. As a result, a big undercut caused from the flaking-off can be prevented.

Though tantalum (Ta) is referred to as a diffusion barrier in the above preferred embodiment other refractory metals or its alloy, such as tantalum nitride (TaN), titanium nitride (TiN), titanium tungsten (TiW), tungsten (W), niobium (Nb), chrome (Cr), manganese (Mn), cobalt (Co) and molybdenum (Mo) may be employed in place of Ta.

Next, upon the electrically conductive film 6 is deposited a typically 400 nm thick $SiO_2$ layer 7L as an etching mask material by Electron Cyclotron Resonance (ECR) method having a bias voltage applied therein. Upon $SiO_2$ layer 7L is formed a first resist pattern 8 of a conventional organic material with a photolithograph technique so as to demarcate the same as the wiring pattern.

Figure 1B:
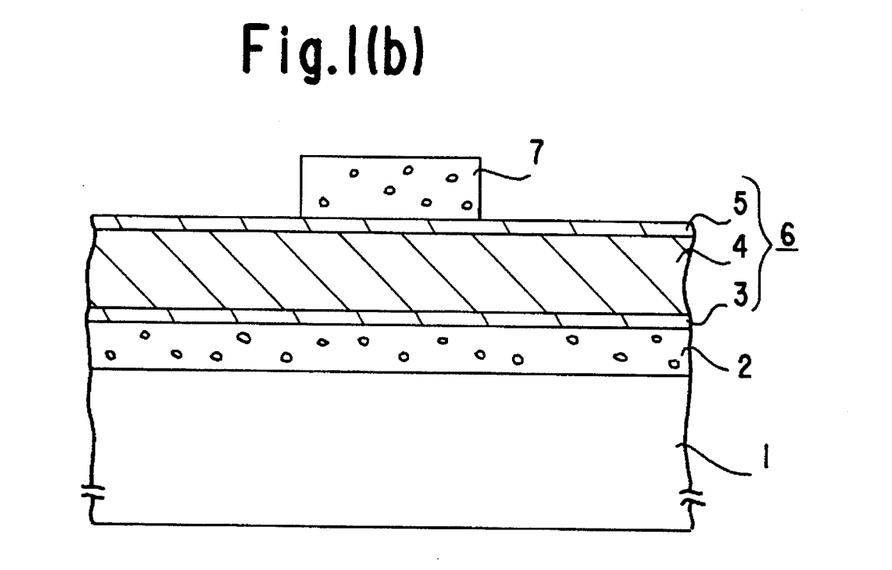

Next, $SiO_2$ layer 7L is etched according to a well-known RIE method using first resist pattern 8 as a mask and typically employing a gas mixture including a fluorine atom so that there is formed a second etching mask pattern 7 to demarcate the wiring pattern as shown in FIG. 1(b). Afterwards, resist pattern 8 is ashed, i.e. burnt, so as to be removed. In the RIE etching of copper film an organic resist mask cannot be used due to a high substrate temperature as described later. Therefore, the etching mask of $SiO_2$ is thus essentially employed.

Figure 2:
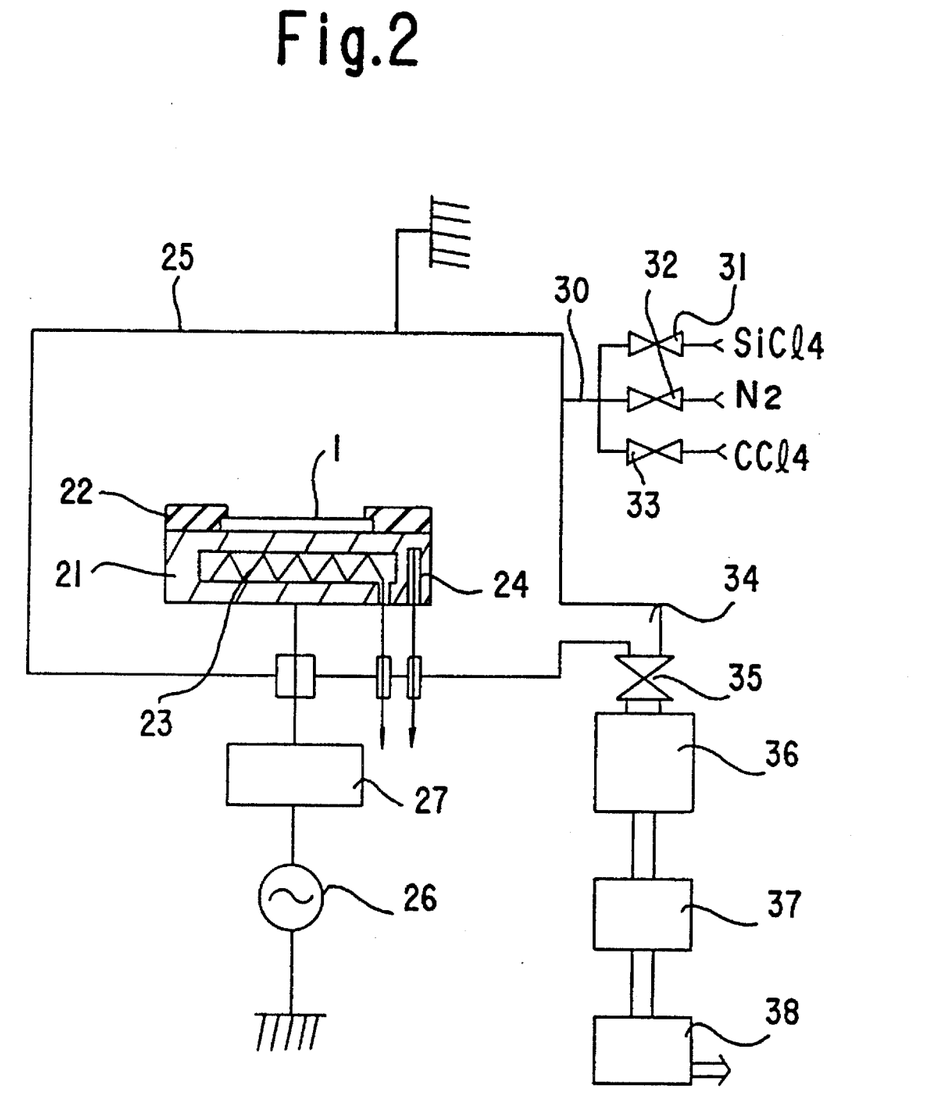
FIG. 2 schematically illustrates a principle diagram of a parallel plate type RIE apparatus employed in the preferred embodiment and in the experiments of the present invention.

Next, the substrate having finished the above-mentioned processes is etched with a RIE apparatus which is well-known and is shown in FIG. 2.

Outline of the RIE device is hereinafter explained. A substrate 10 to be process is fixed at its peripheral portion horizontally onto an etching electrode 21 in a chamber 25 of the RIE apparatus by means of a quartz plate 22. Etching electrode 21 is provided therein with a heater 23 and a thermocouple 24 so as to keep the substrate temperature at a predetermined level during the etching process, together with a temperature controller (not shown in the figure) provided outside the chamber 25. In addition, a high frequency voltage is applied from a high frequency power source 26 via a load matching network 27 to etching electrode 21 so as to generate a plasma 28 in between etching electrode 21 and grounded chamber's inner surface 25i facing the etching electrode 21. At this time, a bias potential is generated between etching electrode 21 and the plasma 28 vertically onto the substrate surface so that the ions are accelerated to vertically bombard the substrate surface. As a result, an anisotropic etching is accomplished similarly to a parallel plate etching apparatus.

Chamber 25 is exhausted through a vacuum outlet 34 via a conductance valve 35 for pressure adjustment by a vacuum pump system including a serial connection of a turbo pump 36, a mechanical booster pump 37 and a rotary pump 38. $SiCl_4$, $N_2$, and $CCl_4$ are mixed while each flow rate is independently controlled by valves 31, 32 and 33, so as to introduce the gas mixture from each gas source via a gas inlet 30 into chamber 25, as shown in FIG. 2.

The optimum condition to achieve the accurate shape as well as the high etching speed is such that the substrate temperature is higher than 250° C., preferably 310° to 330° C.; and CCl₄ gas content is 3 to 20%, preferably 6.6 to 15%, by volume in the gas mixture with SiCl₄ and N₂ preferably by the ration of 60:30:10, where the pressure of the gas mixture in chamber 25 is kept at 1.2 to 3.5 Pa with 150 SCCM flow rate by adjusting conductance valve 35. Then, the plasma is excited by the application of a high frequency voltage of 400 W to etching electrode 21. These conditions are explained further in detail later in the description of the experiments.

In these conditions, the isotropic etching, i.e. a horizontal etching in parallel to the copper layer, of the electrically conductive layer 6 including core copper layer 4 and diffusion barrier 5 formed over core copper layer 4 is suppressed, whereby the electrically conductive layer 6 can be etched in an accurate shape in the cross-sectional view. On the other hand, the vertical etching speed of the surfaces exposed to the ion bombardment is fast, that is, the etching speed of the portion to be removed is fast. Moreover, the etching speed of the mask material, such as SiO₂, is adequately slow. Therefore, electrically conductive layer 6 including copper layer can be etched fast as well as precisely.

In the etching process of electrically conductive layer 6, etching mask pattern 7 formed thereon is utilized as a mask, so that the part of electrically conductive thin film 6 covered with etching mask pattern 7 is left and the exposed area of electrically conductive film 7 is removed, as shown in FIG. 1b. In this process, first insulation film 2 under electrically conductive film 6 functions as an etch stopper.

The etching time of electrically conductive film 6 is seven minutes including the over etching time. The over-etching is in order to prevent a reaction product from remaining upon the surface of insulation film 2 of the substrate. Therefore, if the amounts of the decrease in the film thickness of etching mask pattern 7 and first insulation film 2 of the substrate are allowable, it is desirable to allow the over-etching.

Figure 1C:
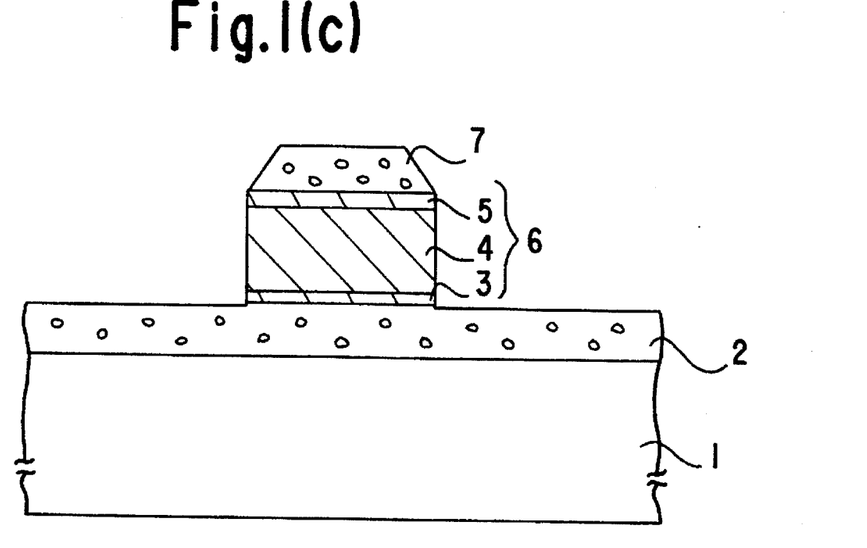

A cross-sectional view of thus etched wiring pattern of electrically conductive film 6 is shown in FIG. 1(c). It is observed there that the sidewalls of the etched wiring pattern 6 were vertically finished, that is none of side-etching was observed there, while some of corners of SiO₂ mask 7 are etched off. Moreover, it was achieved to leave no residues of the reaction product even after as narrow as, for example, 0.2 μm wiring gap was etched out.

Figure 1D:
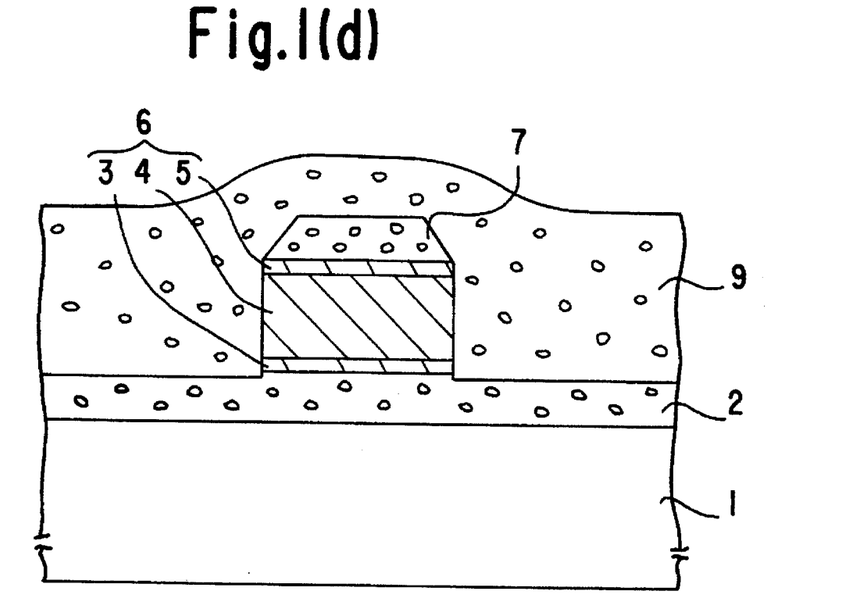

After the above-mentioned RIE process is finished, thereover is generally deposited a third insulation layer 9, which is typically formed of SiO₂. In this case the removal process of etching mask 7 can be omitted, i.e. the mask can be remaining, as shown in FIG. 1(d).

The above-mentioned etching conditions, as the present invention, were attained according to the experiments carried out by the inventor as hereinafter described in detail. Test samples and RIE apparatus used in the experiments are the same as those of the first preferred embodiment shown in FIGS. 1 and FIG. 2.

Figure 3:
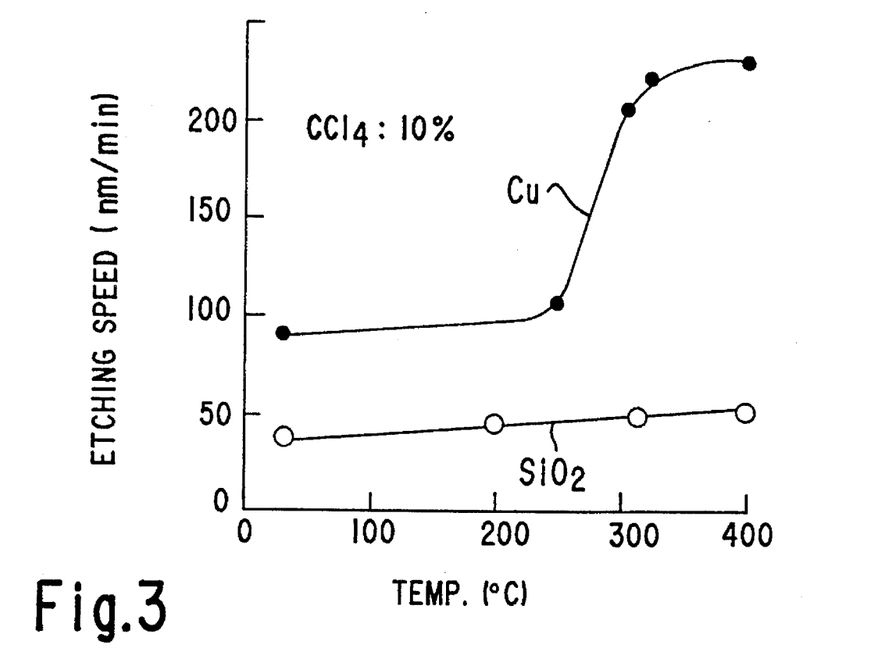
FIG. 3 shows the substrate temperature dependency of the etching speed attained in the first experiment of the present invention.

The first experiment was such that electrically conductive film 6 was etched with RIE while other etching conditions except the substrate temperature were the same as the preferred embodiment while keeping the substrate at some different temperatures, where the etching speed and the shape of the cross-sectional view of the wiring pattern were checked. Thus obtained temperature dependencies of the etching speed of the above-mentioned electrically conductive film and the SiO₂ layer are shown in FIG. 3, where the curve presenting the etching speed of the electrically conductive film is denoted with "Cu", and the curve of the etching speed of the SiO₂ layer is denoted with "SiO₂". At substrate temperature of 250° C. or higher the curve of the etching speed of the electrically conductive film exhibited a stair-like temperature dependency that rises rapidly, thenafter saturates so as to become almost constant at 300° C. or higher. On the other hand, the etching speed curve of the SiO₂ layer hardly depended on the temperature.

The data shows that at a substrate temperature of 250° C. or higher the etching speed of the copper layer increases steeply, as well as increases the etching selectivity-ratio. Therefore, in enhancing the etching accuracy it is preferable for the substrate temperature to be 250° C. or higher. In further enhancing the etching selectivity-ratio, as well as in shortening the etching time it is preferable for the substrate temperature to be kept at 300° C. or more where the etching speed of the electrically conductive film exceeded 200 nm/minute.

However, the substrate temperature also played a part in the formation of side-etching other than in the etching speed. Therefore, the substrate temperature was further examined from the viewpoint of the etching accuracy.

Figure 4:
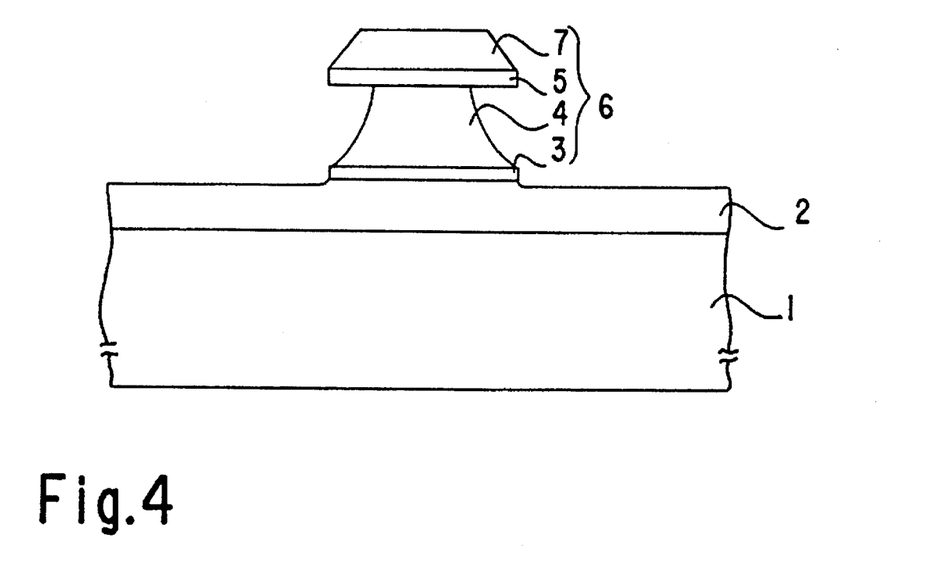
FIGS. 4 to 6 schematically illustrate the substrate temperature dependency of cross-sectional views of the copper wiring pattern attained in the first experiment of the present invention.

In FIG. 4 is shown a cross-sectional view of the wiring pattern formed with the RIE process at a substrate temperature lower than 300° C. while all the other conditions were kept the same as those of the first experiment. At this low temperature, there was observed at core copper layer 4 a side-etching similar to that generated in an isotropic-etching. On the other hand, at thus low substrate temperature no side-etching was caused in Ta diffusion barriers 3 and 5. However, an adhesion of the reaction product was seen on the exposed surface, particularly on the surface of lower SiO₂ layer 2. Undesirable is such an adhesive, which deteriorates the reliability of the semiconductor device. Consequently, in these viewpoints the substrate temperature be preferably chosen higher than 300° C.

Figure 5:
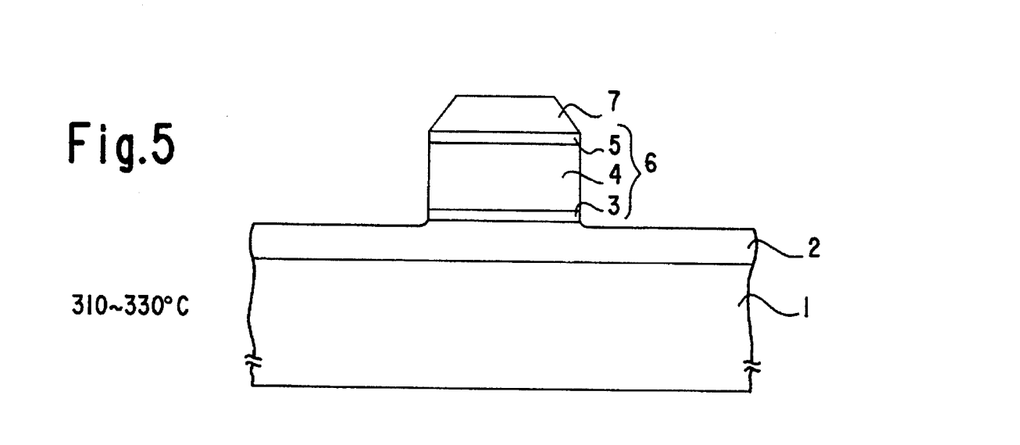

In FIG. 5 is shown a wiring pattern which was RIE processed at a substrate temperature 310° to 330° C. At this temperature range, it was confirmed that neither of copper layer 4 or diffusion barriers 3 and 5 suffered from the side-etching, and the etched walls of electrically conductive film 6 were etched vertically, while the adhesion of the reaction product was hardly seen. Accordingly, the most desirable substrate temperature was the range 310° to 330° C. from the viewpoints of the etching time, the etching accuracy and the reaction product contamination.

Figure 6:
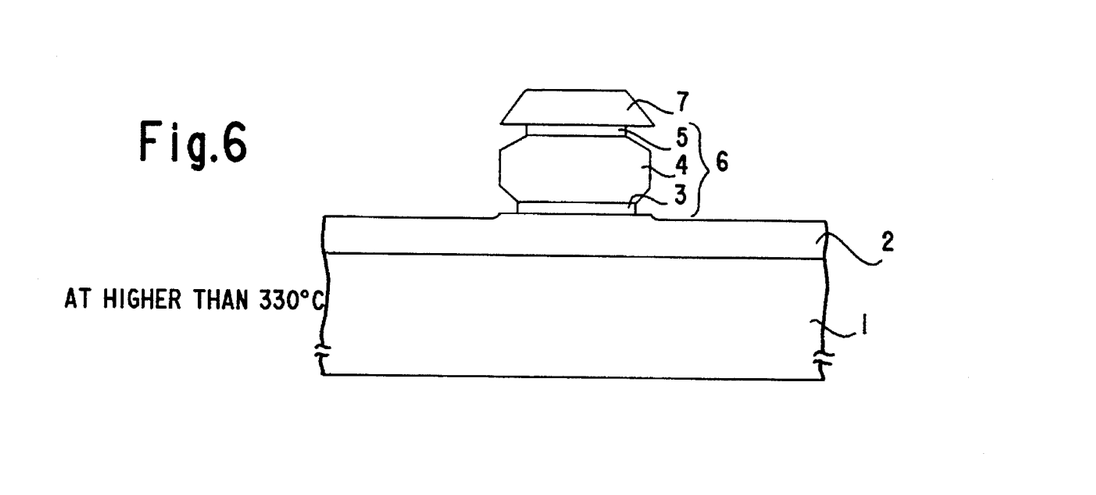

In FIG. 6 is shown a wiring pattern formed at the substrate temperature over 330° C. There was observed a remarkable side-etching on diffusion barriers 3 and 5. In this case, the vicinities of the junctions of core copper layer 4 to diffusion barriers 3 and 5 were so etched as to cause a big undercut even though the sidewall of core copper layer 4 was hardly side-etched. Therefore, this condition was not preferable from the viewpoint of the etching accuracy, however, was excellent in the high etching speed without generating the reaction product.

The above-mentioned reaction product could not be particularly identified. However, it was analyzed that the reaction product effectively prevented the progress of the side-etching by adhering onto the sidewall of core copper layer 4 while promoting the anisotropic, i.e. vertical, etching of the copper layer by the evaporation by the ion bombardment onto the exposed part thereof. It was further analyzed that at the low substrate temperature the etching speed decreased and side-etching of the copper layer increased concurrently because the evaporation of the deposited reaction product by the ion bombardment was slow and the chemical reaction which acts uniformly upon all the surfaces took the main share of etching.

Moreover, it was analyzed that at the high substrate temperature the side-etching shown in FIG. 6 was caused by the fast evaporation of the deposited reaction product, accordingly, the reaction product which should prevent the side-etching did not remain on the sidewall.

In this etching mechanism, it was analyzed that the substrate temperature at which the etching speed increased steeply was determined almost by the kind of the above-mentioned reaction product which consisted of the copper compound and was not influenced largely by the other etching conditions. Therefore, even in the case where the temperature condition was to be determined independently from other conditions, the optimum temperature could be easily found by only a little temperature adjustment at the other conditions modified.

A second experiment was carried out to examine the composition of the gas mixture as the etching gas. In the second experiment, only the amount of the addition of $CCl_4$ of the first experiment was varied and the substrate temperature was kept at 320° C., where the test sample and all the other conditions were the same as those of the first experiment, i.e. of the preferred embodiment.

Figure 7:
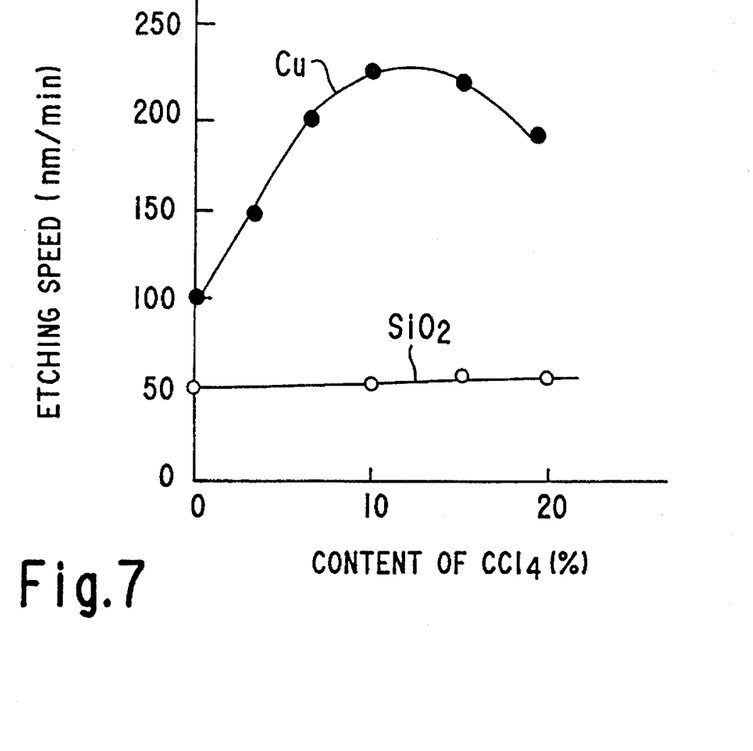
FIG. 7 shows the $CCl_4$ content dependency of the etching speed attained in the second experiment of the present invention.

FIG. 7 shows the dependency of the etching speeds of the electrically conductive film and the $SiO_2$ upon the content of $CCl_4$ in the gas mixture, where the content ratio of $SiCl_4$ and $N_2$ in the gas mixture was kept the same as that of the first experiment.

It is seen in FIG. 7 that the etching speed of the electrically conductive film increased in accordance with the increase in $CCl_4$ content, and then became maximum at about 10% content, while the etching speed of $SiO_2$ hardly depended upon the $CCl_4$ content. As a result, the selectivity of etching of the electrically conductive film and $SiO_2$ film became maximum at 10% $CCl_4$ gas content by volume in gas mixture. This composition allowing the least consumption of $SiO_2$ was most favorable for the etching accuracy.

Figure 8:
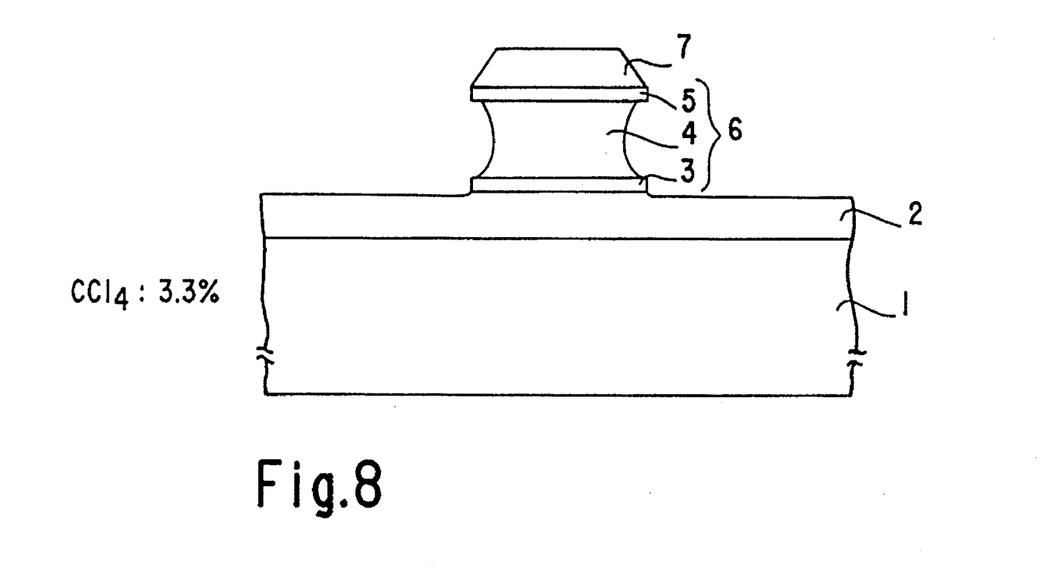
FIGS. 8 to 10 shows the substrate temperature dependency of cross-sectional views of the wiring pattern, upon $CCl_4$ content attained in the third experiment as well as commonly upon $CH_4$ content in the fourth experiment.
Figure 9:
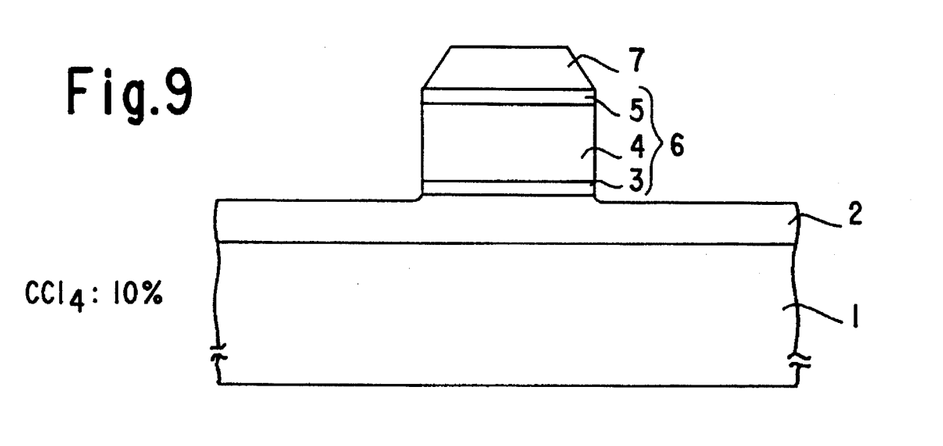
Figure 10:
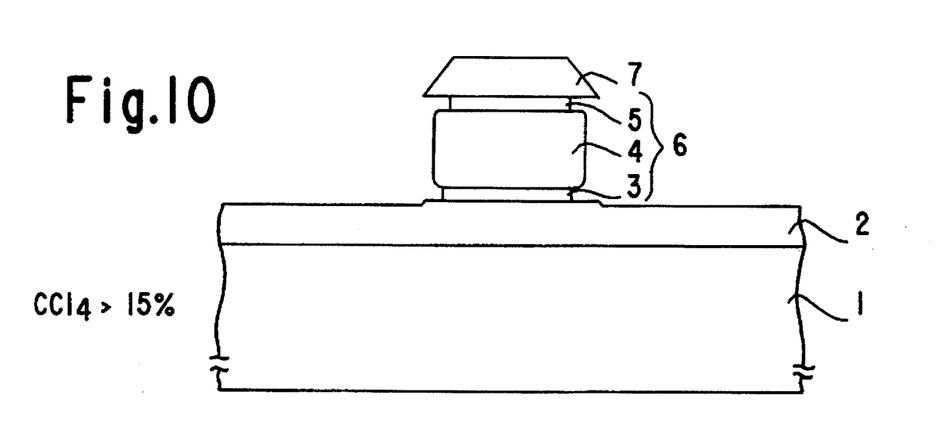

Next, a third experiment was carried out by the present inventor in order to determine optimum condition for the least side-etching, where only the $CCl_4$ content was varied, while the substrate temperature was kept at 320° C., the flow rate of gas mixture at 150 SCCM, and other conditions were kept the same as the second experiment. FIGS. 8 to 10 show the dependency of the shapes of cross-sectional side-view of the electrically conductive pattern upon the gas composition of the gas mixture. In FIG. 8 is shown the wiring pattern when the $CCl_4$ content by volume in the gas mixture was 3.3%. There was observed a big side-etching in core copper layer 14, while none of diffusion barriers 3 and 5 were side-etched. This was because the slow ion etching allowed the isotropic etching to take larger share in the entire etching reaction.

In FIG. 9 is shown the wiring pattern when the $CCl_4$ content was 10% by volume, where there was achieved a flat vertical wall having no side-etching. In the range of 6.6 to 15% $CCl_4$ content, such an accurate pattern were also successfully accomplished like that of FIG. 9. It was analyzed that this accurate anisotropic etching was owing to such optimum conditions that the high etching speed in the vertical direction was resulted from the corporation of the physical bombardment and the chemical reaction while the chemical reaction was not so strong as to remove the reaction products deposited on the side wall.

In FIG. 10 is shown the wiring pattern when the $CCl_4$ content was more than 15% by volume, where remarkable side-etching of diffusion barriers 3 and 5 were seen, and some side-etching was seen in core copper layer 4 as well. This result indicated that the increase of $CCl_4$ promoted the chemical reaction so as to enhance the share of the isotropic etching.

Thus, the data shown in FIGS. 8 to 10 has provided the conclusion that 6.6 to 15% by volume was the optimum for the $CCl_4$ gas content.

Next, a fourth experiment was carried out by the present inventor in order to examine other carbon-containing gas than the above $CCl_4$, where a methane gas $CH_4$ was employed in place of the $CCl_4$ gas, while all the other conditions were kept the same as the third experiment.

Then, a 5% $CH_4$ content by volume caused a big side-etching in core copper layer 4 with none of side-etching on diffusion barriers 3 and 5 as shown in the cross-sectional view in FIG. 8, which was ever referred to in explaining the third experiment.

When the $CH_4$ content was 12% by volume, the etched wiring pattern was such that shown in FIG. 9, which was also ever referred to in explaining the third experiment. There was achieved a flat vertical wall having no side-etching. Also in the range of 8 to 18% $CH_4$ content, such an accurate pattern were successfully accomplished as shown in FIG. 9.

When the $CH_4$ content was more than 18% by volume, a remarkable side-etching of diffusion barriers 3 and 5 were seen as shown in FIG. 10, which was also ever referred to in explaining the previous experiment.

Thus, the data shown in FIGS. 8 to 10 has provided the conclusion that 8 to 18% by volume was the optimum for the $CH_4$ gas content.

Accordingly, it was concluded by the present inventor that the etching speed of the copper layer increased by the addition of carbon compound gas, such as $CCl_4$ or $CH_4$ because the carbon generated from the decomposition of the carbon compound reduced the copper oxide which had been generated on the copper surface. Therefore, there can be employed not only $CCl_4$ and $CH_4$ but also ethane ($C_2H_6$), propane ($C_3H_8$) gas and so on as the carbon compound gas to be decomposed in plasma to generate the carbon.

Summarizing the experiments for the present invention, it was concluded that the evaporation of the reaction product by the ion bombardment and the existence of proper amounts of carbon and chlorine each of which reacts with the copper of the alloy mainly comprising copper were necessarily balanced so that the copper/copper-alloy layer can be effectively etched in the RIE.

Though in the prior art reference for etching an Al-1% Si-1% Cu alloy film referred to in the BACKGROUND of the present specification there was employed the same gasses, $SiCl_4$, $N_2$ and $CCl_4$, so as to accomplish an accurate pattern leaving none of copper residuals, the $CCl_4$ content was as high as 30%. However, the same etching gas containing such a high density of $CCl_4$ could not be immediately employed to the copper or mainly-copper film, because not only the etching speed of the film was so slow but also a big side-etching would be caused as proved in the above experiments. It is clear that such a difference in the result were caused from the difference of the film materials, i.e. the difference between the mainly-copper film and the aluminum alloy film containing only 1% copper content.

Thus, the results of the above experiments have revealed that in etching the copper or mainly copper film the maximum of etching speed occurred at low $CCl_4$ content in the etching gas, moreover at the almost same content range the side-etching of the film became minimum. This was significantly distinct from the etching of Al alloy film including 1% copper content. These facts have taught the necessity of employing such a unique etching gas that included lower $CCl_4$ content in etching the copper film.

As for the gas pressure in the above experiments, the most accurate etching results were accomplished at 1.2 Pa to 3.5 Pa gas pressure of the gas mixture. In this gas pressure range the gas pressure gave little effect on the etching accuracy. Generally, low gas pressures have been preferably employed so as to reduce the damage caused by the ion bombardment onto the surface to be etched. However, in many practical cases the gas pressures are determined chiefly so as to meet the characteristic of the RIE apparatus, for example, at the range where the plasma can be maintained stably. Accordingly, the gas pressure may be determined at a pressure optimum for the kind of etching gas, etching condition and etching apparatus.

When the pressure in chamber 25 is set at 3.5 Pa and other etching conditions were set in the above-mentioned conditions, the etching speed of the electrically conductive film 6 was 220 nm/min. and the etching speed of $SiO_2$ was 50 nm/min. Thus, the selection ratio of the electrically conductive film to $SiO_2$ was 4.4. This large amount of the etching speed ratio to the etching mask allowed an easy fabrication of a precise wiring pattern. Diffusion barriers 2 and 5 provided on both the surfaces of core copper layer 4 was so thin that their influence on the etching time of the entire electrically conductive film 6 could be disregarded.

The present invention is not limited to the manufacture of the wiring pattern of the above-referred semiconductor device, but also can be applied to other usages, such as in manufacturing a device in which a copper-containing wiring is patterned on a substrate, such as a hybrid integrated circuits; in manufacturing a silicon-on-sapphire device, generally called an SOl, or in etching a general copper-containing film on a substrate.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not detailed to limit the invention and accordingly, all suitable modifications are equivalents may be resorted to, falling within the scope of the invention.

What I claim is:

1. A method to etch an electrically conductive film, comprising the steps of:

forming a metal conductor film comprising a layer consisting essentially of copper upon a substrate; and forming a mask pattern, covering a part of said metal conductor film and exposing another part of said metal conductor film upon said metal conductor film; and etching said exposed part of said metal conductor film by the use of said mask pattern and a reactive ion-etching (RIE) gas mixture plasma comprising silicon tetrachloride ($SiCl_4$) gas, nitrogen ($N_2$) gas, and a hydrocarbon compound containing gas, whereby said exposed part of said metal conductor film is removed so as to leave a flat etched side of said metal conductor film.

2. The method according to claim 1, wherein said copper layer comprises an alloy of silicon in copper.

3. The method according to claim 1, wherein said metal conductor film further comprises a diffusion protecting layer comprising a refractory metal.

4. The method according to claim 3, wherein said refractory metal is selected from the group consisting of tantalum (Ta), tantalum nitride (TaN), titanium nitride (TiN), titanium tungsten (TiW), tungsten (W), niobium (Nb), chromium (Cr), manganese (Mn), cobalt (Co) and molybdenum (Mo.).

5. The method according to claim 1, wherein said mask pattern comprises silicon dioxide ($SiO_2$).

6. The method according to claim 1, wherein said substrate further comprises an insulating layer thereon in contact with said metal conductor film.

7. The method according to claim 6, wherein said insulating film comprises silicon dioxide ($SiO_2$).

8. The method according to claim 1, wherein said gas mixture consists essentially of silicon tetra-chloride ($SiCl_4$) gas, and nitrogen ($N_2$) gas, and a hydrocarbon compound containing gas.

9. The method according to claim 1, wherein said hydrocarbon compound containing gas is at least one member selected from the group consisting of methane ($CH_4$), ethane ($C_2H_6$) and propane ($C_3H_8$).

10. The method according to claim 9, wherein said hydrocarbon compound containing gas comprises 8 to 18% by volume of said gas mixture plasma.

11. The method according to claim 1, wherein said etching is performed at a substrate temperature of higher than 250° C.

12. The method according to claim 11, wherein said etching is performed at a substrate temperature of 310° to 330° C.

13. The method as claimed in claim 3, wherein said refractory metal is a component of an alloy.

14. The method as claimed in claim 3, wherein said diffusion protection layer is disposed between said layer consisting essentially of copper and said substrate.

15. The method as claimed in claim 3, wherein said diffusion protection layer is disposed between said layer consisting essentially of copper and said mask.

16. The method according to claim 10, wherein said hydrocarbon compound component of said gas is methane.

* * * * *